United States Patent
Kim et al.

[11] Patent Number: 6,081,017
[45] Date of Patent: Jun. 27, 2000

[54] SELF-BIASED SOLAR CELL AND MODULE ADOPTING THE SAME

[75] Inventors: Dong-seop Kim, Seoul; Il-whan Ji; Soo-hong Lee, both of Suwon, all of Rep. of Korea

[73] Assignee: Samsung Electronics Co., Ltd., Suwon, Rep. of Korea

[21] Appl. No.: 09/084,881

[22] Filed: May 28, 1998

[51] Int. Cl.[7] .............. H01L 31/00; H01L 31/06
[52] U.S. Cl. ............ 257/431; 257/448; 257/461; 257/457; 136/252; 136/256
[58] Field of Search .................. 257/431, 433, 257/436, 457, 461, 448; 136/251, 252, 256

[56] References Cited

U.S. PATENT DOCUMENTS

| | | | |
|---|---|---|---|
| 3,957,537 | 5/1976 | Baskett et al. | 136/89 |
| 3,994,012 | 11/1976 | Warner, Jr. | 257/506 |
| 4,824,489 | 4/1989 | Cogan et al. | 136/256 |
| 5,397,401 | 3/1995 | Toma et al. | 136/259 |
| 5,728,230 | 3/1998 | Komori et al. | 136/251 |
| 5,759,291 | 6/1998 | Ichinose et al. | 136/256 |
| 5,800,631 | 9/1998 | Yamada et al. | 136/251 |

*Primary Examiner*—Mahshid Saadat
*Assistant Examiner*—Allan R. Wilson
*Attorney, Agent, or Firm*—Burns, Doane, Swecker & Mathis, LLP

[57] ABSTRACT

A self-biased solar cell and a module adopting the solar cell. The self-biased solar cell includes a semiconductor substrate of first conductivity type, a semiconductor layer of second conductivity type disposed adjacent to the first surface of the semiconductor substrate, at least one more first electrodes formed adjacent to the semiconductor layer; at least one more dielectric layers formed on the second surface of the semiconductor substrate, at least one or more second electodes formed on the second surface of the semiconductor substrate, the second electodes being disposed adjacent to the dielectric layers, and at least one or more voltage applying electrode formed on the dielectric layers. Therefore, recombination loss of the carriers according to the formation of a back surface field is comparatively decreased, and open voltage and quantum efficiency at a long wavelength are increased.

15 Claims, 3 Drawing Sheets

SELF-BIASED SOLAR CELL AND MODULE ADOPTING THE SAME

BACKGROUND OF THE INVENTION

1. Field of the Invention

The present invention relates to a self-biased solar cell and a module adopting the solar cell, and more particularly, to a self-biased solar cell having improved conversion efficiency, in which recombination loss of carriers at the rear and front of the solar cell; is decreased, and open voltage and quantum yield at long and short wavelengths are increased, and a module adopting the solar cell.

2. Description of the Related Art

A solar cell uses the effect of an optical electromotive force of a semiconductor, and is manufactured by combining a p-type semiconductor and an n-type semiconductor. When light is irradiated onto a junction (p-n junction) between the p-type semiconductor and the n-type semiconductor, negative charges (electrons) and positive charges (positive holes) are generated in the semiconductor by the light energy.

Generally, when light whose energy is lower than a band gap energy is incident on the solar cell, electrons in the semiconductors reacts weakly with each other. Meanwhile, when light having more than the band gap energy is incident on the semiconductor, electrons in covalent bonds are excited, generating carriers (electrons or positive holes).

The carriers generated by the light return to a normal state through a recombination process. The time taken for the carriers to return to the normal state after generation is called "carrier lifetime".

The electrons and positive holes generated by the light energy migrate toward the n-type and p-type semiconductors due to an the internal electric field, to be collected at electrode portions at two ends. When two electrodes are interconnected by a conducting wire, power of desired voltage and current is generated.

Generally, when the electric field is applied to the whole light absorption layer, the lifetime of the carriers excited by the light is increased. Forming the electric field on the light absorption layer can be achieved by controlling a doping profile in a bulk region. However, this method can be applied only when the amount of dopant can be controlled while silicon is grown.

Generally, it is expected that the electric field effect is further increased near the p-n junction rather than at the rear side of the solar cell Also, a back surface field (BSF) is formed by diffusing dopant into the rear side of the electrode. When the electric field is formed at the back surface of the battery, the carriers excited by the light are reflected, thereby reducing loss by the recombination of the carriers and increasing open voltage and quantum effect at long wavelengths.

A buried contact solar cell (BCSC), one of solar cells having the excellent efficiency, has the structure shown in FIG. 1. In order to manufacture a solar cell having such a structure, a back surface electrode 15 is formed by depositing aluminum (Al) and then sintering the deposited Al to form the electric field at the back surface of the battery for reducing contact resistance. Here, reference numeral 11 represents the upper surface of a semiconductor substrate, reference numeral 12 represents a front surface electrode, reference numeral 13 represents groove, and reference numeral 14 represents a semiconductor substrate.

When sintering Al to form the BSF, a thermal process at a high temperature is performed for a long time. Via the thermal process, Al forms a solid solution and the silicon at the back surface of the semiconductor substrate is severely damaged. As a result, carriers are recombined at the back surface of the semiconductor substrate.

To overcome such problems, grooves are formed at the back surface of the semiconductor substrate to form electrode, and phosphate is doped on the remaining portion to form a floating junction film, thereby reducing the recombination of carriers at the back surface. The battery manufactured based on this is a double side buried contact solar cell (DSBC) shown in FIG. 2.

However, such DCBC has a shunt path between a back surface electrode 25 and a floating junction layer 26, so that the effect by the BSF is less than expected.

As described above, the effect of the BSF or the floating junction layer formed in the conventional BCSC and DSBC is less than expected.

SUMMARY OF THE INVENTION

To solve the above problems, it is an objective of the present invention to provide a self-biased solar cell improved in a conversion efficiency, in which recombination loss of carriers at a back surface of the battery is decreased, and open circuit voltage and quantum efficiency near a long wavelength are increased.

It is another objective of the present invention to provide a module adopting the self-biased solar cell.

Accordingly, to achieve the above first objective, there is provided a self-biased solar cell comprising:

a semiconductor substrate of first conductivity type;

a semiconductor layer of second conductivity type disposed adjacent to the first surface of the semiconductor substrate;

at least one more first electrodes formed adjacent to the semiconductor layer;

at least one more dielectric layers formed on the second surface of the semiconductor substrate;

at least one or more second electodes formed on the second surface of the semiconductor substrate, the second electodes being disposed adjacent to the dielectric layers; and at least one or more voltage applying electrode formed in the dielectric layers.

Preferably, the voltage applying electrodes include at least one material selected from the group consisting of conductive metals such as aluminum, copper, silver, iron, titanium and palladium, conductive metal oxides thereof, tin oxide ($SnO_2$), zinc oxide ($ZnO_2$) and indium thin oxide (ITO).

Preferably, the first electrodes are formed by coating one or more grooves formed in the front surface of the semiconductor substrate with a conductive metal, and the second electrodes are formed by coating one or more grooves formed in the back surface of the semiconductor substrate with a conductive metal. Here, the conductive metal may be at least one selected from the group consisting of nickel, copper and silver.

To achieve the second objective, there is provided a module of a solar cell, comprising a glass plate, an ethylene-vinylacetate copolymer plate, a solar cell, a dielectric plate, an ethylene-vinylacetate copolymer plate and a Tedlar (polyvinylfluoride) in sequence, wherein the solar cell comprises:

a semiconductor substrate of first conductivity type;

a semiconductor layer of second conductivity type disposed adjacent to the first surface of the semiconductor substrate;

at least one more first electrodes formed adjacent to the semiconductor layer;

at least one more dielectric layers formed on the second surface of the semiconductor substrate;

at least one or more second electodes formed on the second surface of the semiconductor substrate, the second electodes being disposed adjacent to the dielectric layers; and at least one or more voltage applying electrode formed on the dielectric layers.

Preferably, the module of the solar cell further comprises a metal plate between the dielectric plate and the ethylene-vinylacetate copolymer plate. Here, an electrical field may be formed by applying voltage from the module or the external voltage.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENT

Figure 1:
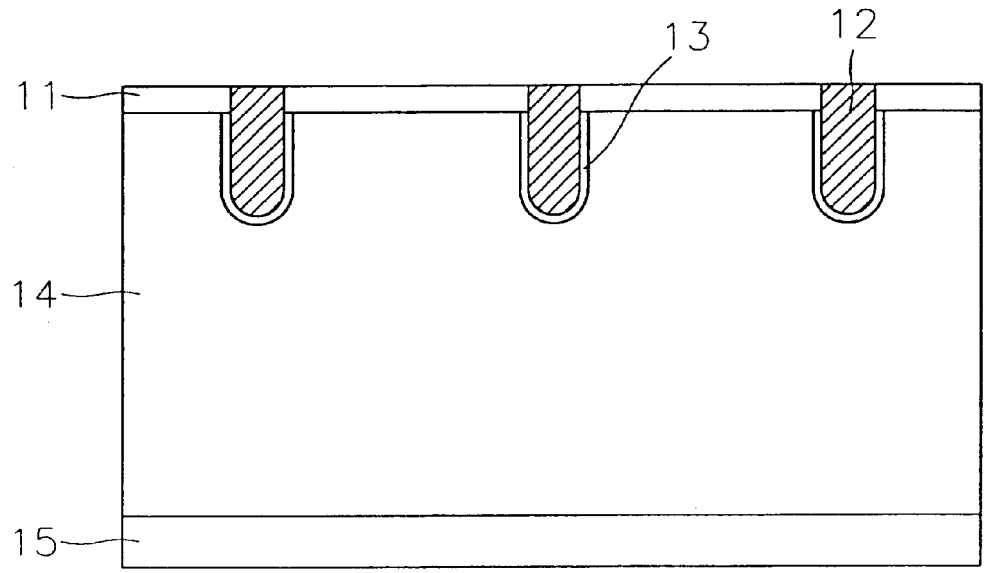
FIG. 1 is a diagram showing the structure of a conventional buried contact solar cell (BCSC)
Figure 2:
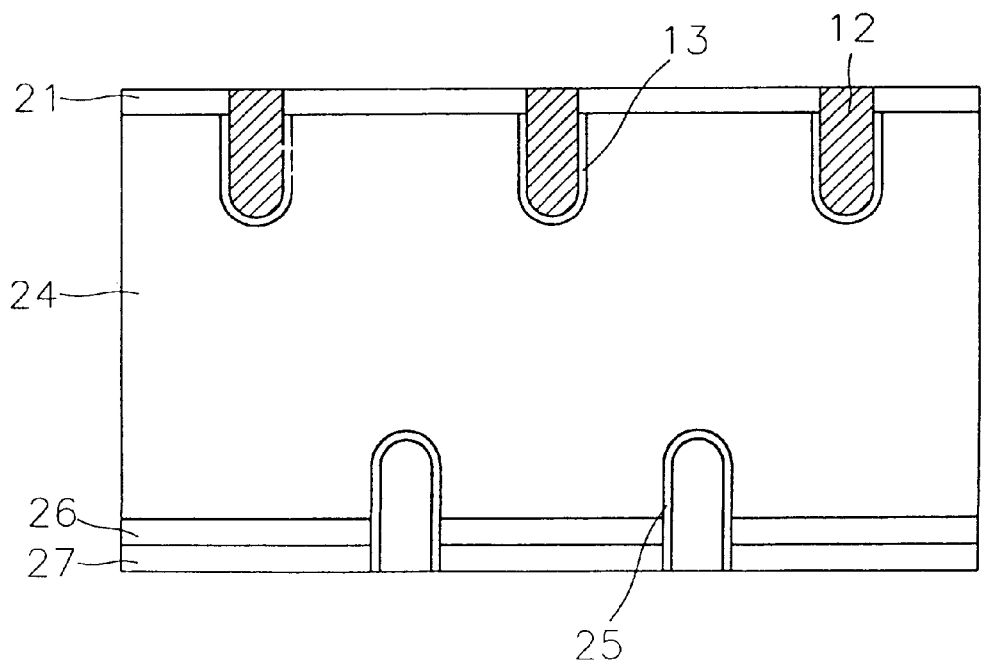
FIG. 2 is a diagram showing the structure of a conventional a double side buried contact solar cell (DSBC)
Figure 3:
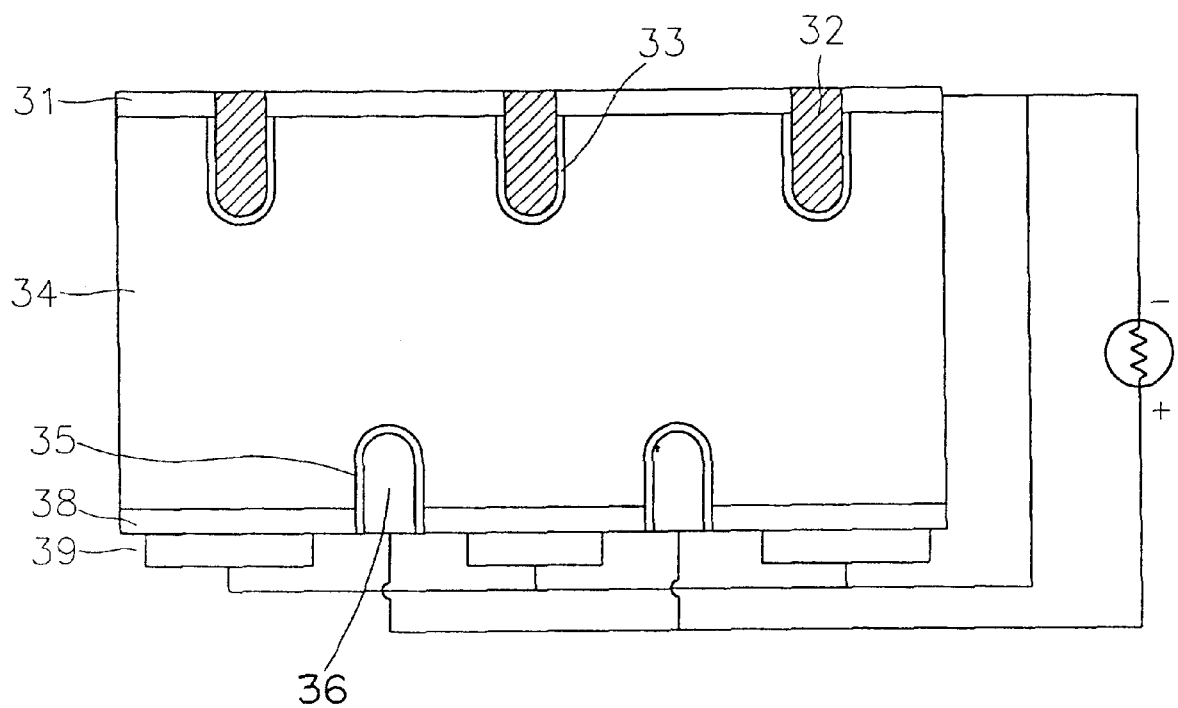
FIG. 3 is a diagram showing the structure of a self-biased solar cell according to the present invention.

Referring to FIG. 3, a self-biased solar cell according to the present invention will be described.

On a front surface of a semiconductor substrate 34 of first conductivity type having a polygonal structure, one or more grooves 33 are formed and first electrodes 32 are formed therein. The first electrodes 32 are formed by plating the grooves 33 with a conductive metal. Reference numeral 31 represents a semiconductor layer of second conductivity type formed on the upper surface of the semiconductor substrate 34. When using a p-type semiconductor substrate as the semiconductor substrate 34, a p-n junction is formed on the upper surface 31 of the semiconductor device, thereby forming an $n^+$ semiconductor layer.

As in the front surface of the semiconductor substrate 34, one or more grooves are formed on the back surface of the semiconductor substrate 34 having a planarized surface structure, and second electrodes 36 are formed in the grooves 35. The dielectric film 38 is formed of silicon oxide, and a voltage applying electrode 39 is formed on the dielectric film 38.

The voltage applying electrode 39 is formed of a conductive metal such as aluminum (Al), copper (Cu) and silver (Ag), and the conductive metal oxides thereof. When using the light incident onto the back surface and biasing front surface, preferably, the voltage applying electrode 39 is formed of a conductive transparent oxide such as tin oxide ($SnO_2$), zinc oxide ($ZnO_2$) and indium tin oxide (ITO). After forming the voltage applying electrode 39, a voltage is applied to accumulate positive holes in a $p^+$ region, resulting in a BSF. If the level of the applied voltage is too low, the electric field is applied to the back surface while total voltage is increased by connecting solar cells in series.

Figure 4:
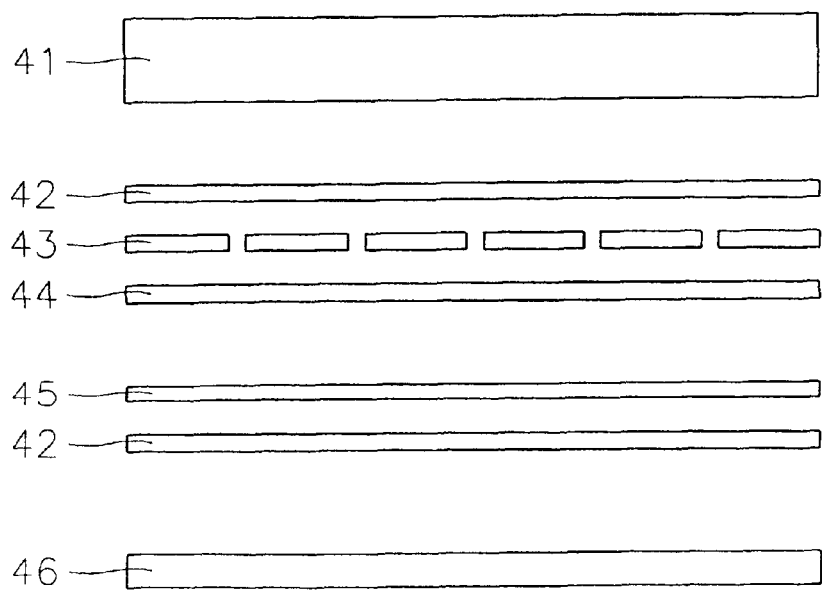
FIG. 4 is a diagram showing the structure of a module adopting the self-biased solar cell according to the present invention.

A solar cell module according to a preferred embodiment of the present invention is shown in FIG. 4.

Referring to FIG. 4, a metal or another conductive plate 45 is attached to the back surface of the cell, and a voltage from the module or an external voltage is applied thereto, forming the electrical field on the back surface of the cell. Reference numeral 41 represents a glass plate, reference numeral 42 represents a plate of a copolymer such as ethylene-vinylacetate, reference numeral 43 represents a self-biased solar cell of the present invention, reference numeral 44 represents a dielectric plate, and reference numeral 46 represents a tedlar.

When an electrical field is formed at the back surface of the cell as described above to manufacture a solar cell module, the lifetime of the carriers over the entire cell is increased, thus a low-quality silicon substrate or a thin silicon substrate may be used.

Figure 5:
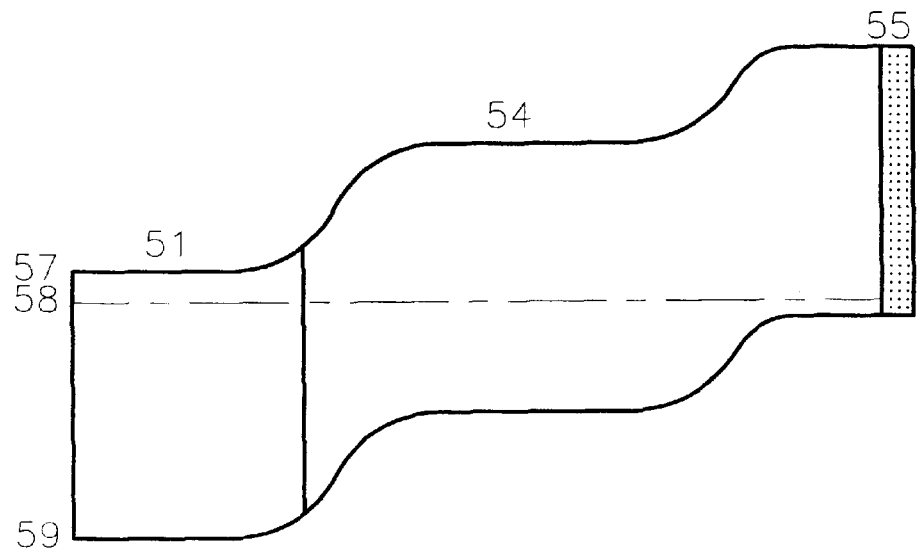
FIG. 5 is an energy band diagram of the conventional BCSC.
Figure 6:
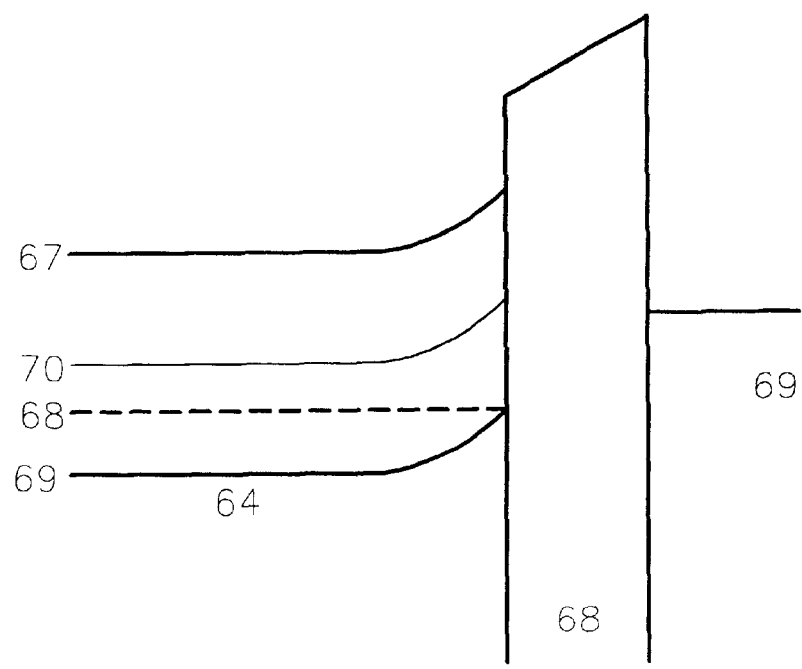
FIG. 6 is an energy band diagram of the self-biased solar cell according to the present invention.

FIG. 5 is an energy band diagram of the conventional BCSC, and FIG. 6 is an energy band diagram of the solar cell according to the present invention. Reference numerals 57 and 67 represent conduction bands, reference numerals 58 and 59 represent the Fermi level, reference numerals 59 and 69 represent valence electron band, and reference numeral 70 represents an intrinsic energy level.

Comparing two energy band diagrams of FIGS. 5 and 6, recombination loss of the carriers at the back surface of the cell is smaller in the cell of the present invention than the conventional BCSC.

In the self-biased solar cell of the present invention, recombination loss of the carriers according at the formation of the electric field of the front and rear surface is decreased compared with the conventional solar cell, and open voltage and quantum efficiency at a long wavelength are increased, thereby improving conversion efficiency of the cell.

Thus, it is preferably to use the self-biased solar cell of the present invention as a thin film type solar cell rather than as a thick film type solar cell. This is because recombination loss of the carriers at the back surface of the electrode further affects on the cell characteristics in the thin film type solar cell, compared with the thick film type solar cell.

What is claimed is:

1. A self-biased solar cell comprising:

a semiconductor substrate of first conductivity type;

a semiconductor layer of second conductivity type disposed adjacent to a first surface of the semiconductor substrate;

at least one first electrode formed adjacent to the semiconductor layer;

at least one dielectric layer formed on a second surface of the semiconductor substrate;

at least one second electrode on the second surface of the semiconductor substrate, the at least one second electrode being disposed adjacent to the at least one dielectric layer; and at least one voltage applying electrode, which is separate and distinct from the at least one second electrode, on the at least one dielectric layer.

2. The self-biased solar cell of claim 1, wherein the at least one voltage applying electrode includes at least one material selected from the group consisting of aluminum, copper, silver, iron, palladium, oxide, tin oxide, zinc oxide and indium tin oxide.

3. The self-biased solar cell of claim 1, wherein the at least one first electrode includes one or more grooves in the front surface of the semiconductor substrate and a conductive metal in said one or more grooves.

4. The self-biased solar cell of claim 3, wherein the conductive metal is at least one metal selected from the group consisting of nickel, copper and silver.

5. The self-biased solar cell of claim 1, wherein the at least one second electrode includes one or more grooves in the back surface of the semiconductor substrate and a conductive metal in said one or more grooves.

6. The self-biased solar cell of claim 5, wherein the conductive metal is at least one metal selected from the group consisting of nickel, copper and silver.

7. A module of a solar cell, comprising a glass plate, a first copolymer plate, a solar cell, a dielectric plate, a second copolymer plate and a Tedlar (polyvinylfluoride) in sequence, wherein the solar cell comprises:
a semiconductor substrate of first conductivity type;
a semiconductor layer of second conductivity type disposed adjacent to a first surface of the semiconductor substrate;
at least one first electrode adjacent to the semiconductor layer;
at least one dielectric layer on a second surface of the semiconductor substrate;
at least one second electrode on the second surface of the semiconductor substrate, the at least one second electrodes being disposed adjacent to the at least one dielectric layer; and
at least one voltage applying electrode, which is separate and distinct from the at least one second electrode, on the at least one dielectric layer.

8. The module of claim 7, further comprising a metal plate between the dielectric plate and the second copolymer plate.

9. The module of claim 7, wherein the at least one voltage applying electrode include at least one material selected from the group consisting of aluminum, copper, silver, iron, palladium, tin oxide, zinc oxide and indium thin oxide.

10. The module of claim 7, wherein the at least one first electrode includes one or more grooves in the front surface of the semiconductor substrate and a conductive metal in the one or more grooves.

11. The module of claim 10, wherein the conductive metal is at least one metal selected from the group consisting of nickel, copper and silver.

12. The module of claim 7, wherein the at least one second electrode one or more grooves in the back surface of the semiconductor substrate and a conductive metal in the one or more grooves.

13. The module of claim 12, wherein the conductive metal is at least one metal selected from the group consisting of nickel, copper and silver.

14. The self-biased solar cell of claim 1, wherein the semiconductor layer of second conductivity type is electrically connected to at least one second electrode formed on the second surface of the semiconductor substrate.

15. The module of claim 7, wherein the semiconductor layer of second conductivity type is electrically connected to at least one second electrode formed on the second surface of the semiconductor substrate.

* * * * *